United States Patent
Su et al.

(10) Patent No.: US 9,235,676 B2
(45) Date of Patent: Jan. 12, 2016

(54) METHOD AND APPARATUS FOR OPTICAL PROXIMITY CORRECTION

(71) Applicant: TAIWAN SEMICONDUCTOR MANUFACTURING COMPANY LTD., Hsinchu (TW)

(72) Inventors: Chuan-Fang Su, Tainan (TW);
Chih-Chun Hsu, New Taipei (TW);
Hsing-Wang Chen, Tainan (TW);
Rung-Shiang Chen, Tainan (TW);
Ching-Juinn Huang, Changhua (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 75 days.

(21) Appl. No.: 14/262,082

(22) Filed: Apr. 25, 2014

(65) Prior Publication Data

US 2015/0310156 A1 Oct. 29, 2015

(51) Int. Cl.
*G06F 17/50* (2006.01)
(52) U.S. Cl.
CPC .................................. *G06F 17/5081* (2013.01)
(58) Field of Classification Search
CPC ............ G06F 7/70433; G06F 7/70591; G06F 7/70616; G06F 7/0002; G06F 17/5081; G06F 2217/12; G06F 17/5077
USPC ............. 716/50–55, 110–111, 118–119, 132, 716/135, 139
See application file for complete search history.

(56) References Cited

U.S. PATENT DOCUMENTS

| | | | | |
|---|---|---|---|---|
| 8,151,219 B2 * | 4/2012 | Huckabay | ........... | G06F 17/5068 716/50 |
| 8,347,241 B2 * | 1/2013 | Nakajima | ........... | G06F 17/5068 716/110 |

* cited by examiner

*Primary Examiner* — Nghia Doan
(74) *Attorney, Agent, or Firm* — Chun-Ming Shih

(57) ABSTRACT

Some embodiments of the present disclosure provide an integrated circuit (IC) design method. The method includes (1) receiving a first layout comprising stripe patterns with a first separation and a first width; (2) receiving a second layout comprising stripe patterns with a second width narrower than the first separation, each stripe on the second layout is configured to situate between two adjacent stripes on the first layout when overlaying the first layout and the second layout; (3) performing a separation check by identifying a spacing between a stripe on the second layout and one of the two adjacent stripes on the first layout; and (4) adjusting the spacing between the stripe on the second layout and one of the two adjacent stripes on the first layout when the separation check determining the spacing is greater than a predetermined value.

20 Claims, 10 Drawing Sheets

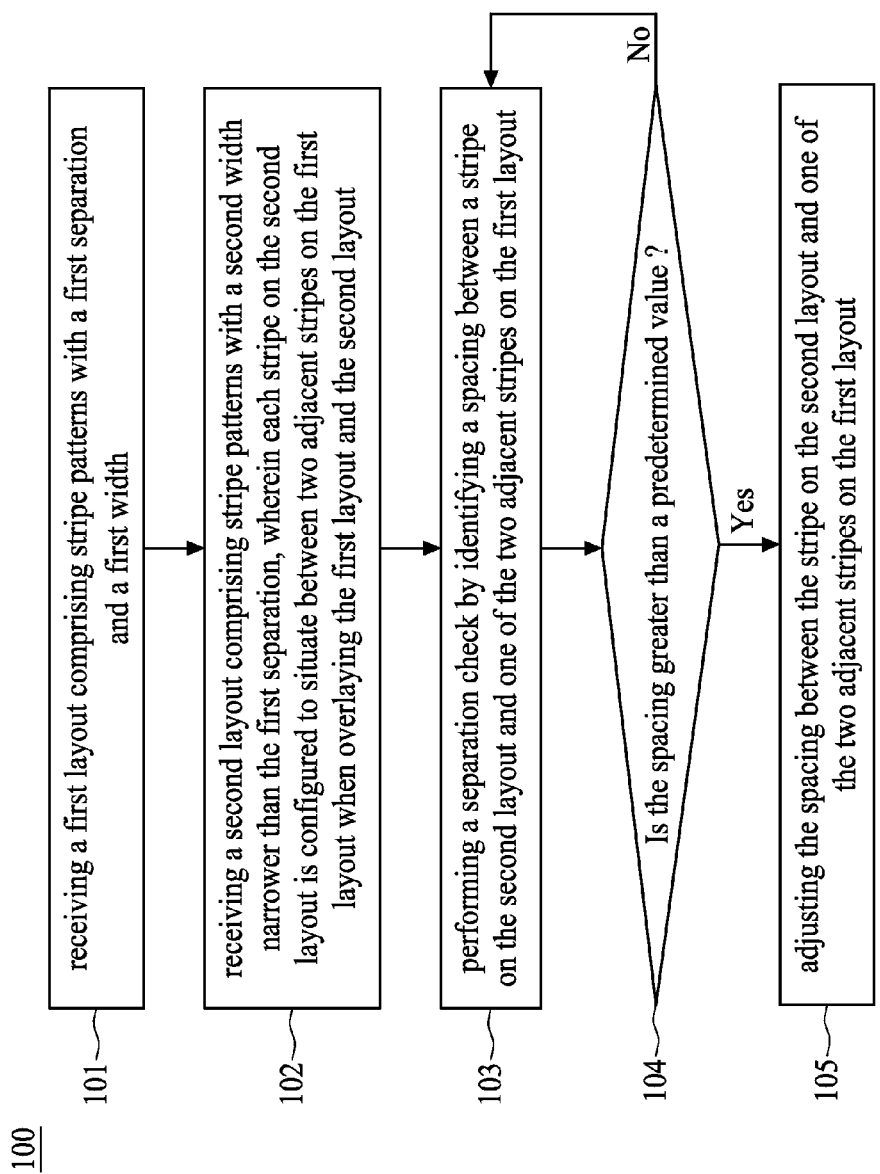

METHOD AND APPARATUS FOR OPTICAL PROXIMITY CORRECTION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as IC technologies are continually progressing to smaller technology nodes, such as 65 nm technology node, 45 nm technology node, 20 nm technology node and below, simply scaling down similar designs used at larger feature sizes often results in poorly shaped or poorly arranged device features. Typically, optical proximity correction (OPC) may be performed on a design pattern before the pattern is created on a mask. However, current OPC techniques may not offer great enough fidelity or sufficient rules to correct problems in sub-45 nm designs. Therefore, although existing methods for improving IC manufacturing have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a high-level flowchart of an IC design method according to various aspects of the present disclosure.

DETAILED DESCRIPTION

Figure 2A:
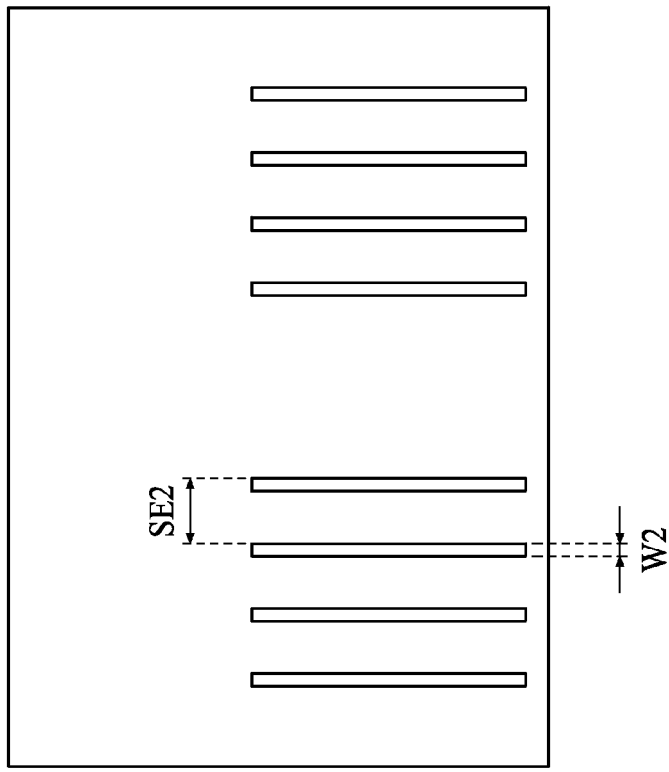
FIG. 2A is an exemplified first layout, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC manufacturing system includes a plurality of entities, such as a design house, a mask house, and an IC manufacturer (i.e., a fab), that interact with one another in the design, development, and manufacturing cycles and/or services related to manufacturing an integrated circuit (IC) device. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house, mask house, and IC manufacturer may be a single entity or separate entities.

The design house generates an IC design layout. The IC design layout includes various geometrical patterns designed for an IC product, based on a specification of the IC product to be manufactured. The geometrical patterns correspond to patterns of metal, oxide, or semiconductor layers that make up the various components of the IC device to be fabricated. The various layers combine to form various IC features. For example, a portion of the IC design layout includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house implements a proper design procedure to form the IC design layout. The design procedure may include logic design, physical design, and/or place and route.

The mask house uses the IC design layout to manufacture one or more masks to be used for fabricating the various layers of the IC product according to the IC design layout. The mask house performs mask data preparation, where the IC design layout is translated into a form that can be physically written by a mask writer, and mask fabrication, where the design layout prepared by the mask data preparation is modified to comply with a particular mask writer and/or mask manufacturer and is then fabricated.

An IC manufacturer, such as a semiconductor foundry, uses the mask (or masks) fabricated by the mask house to fabricate the IC device. The IC manufacturer is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the mid and/or back end fabrication for the metal contact, interconnection, and packaging of the IC products (i.e., mid-end-of-line (MEOL) and back-end-of-line (BEOL) fabrication), and a third manufacturing facility may provide other services for the foundry business.

In the present disclosure, a semiconductor wafer is fabricated using the mask (or masks) to form the IC device. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing operations). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable operations.

Along with the increase of functional density, 45 nm and below technology nodes may face the challenge of device performance deterioration due to insufficient line spacing. For example, if the relative position of the contact of the source or drain region is, at the IC design layout stage, designed on a first mask for being less than about 20 nm away from the adjacent gate contact on a second mask (measured when the first mask and the second mask are overlaid), the corresponding field effect transistor may suffer an increase of the breakdown voltage and the subsequent process window can be inevitably narrowed. Therefore, an OPC rule preventing the deterioration of the device performance is proposed in the present disclosure, in order to maintain the desired breakdown voltage and retain sufficiently large process window for the subsequent manufacturing operations.

Figure 2B:
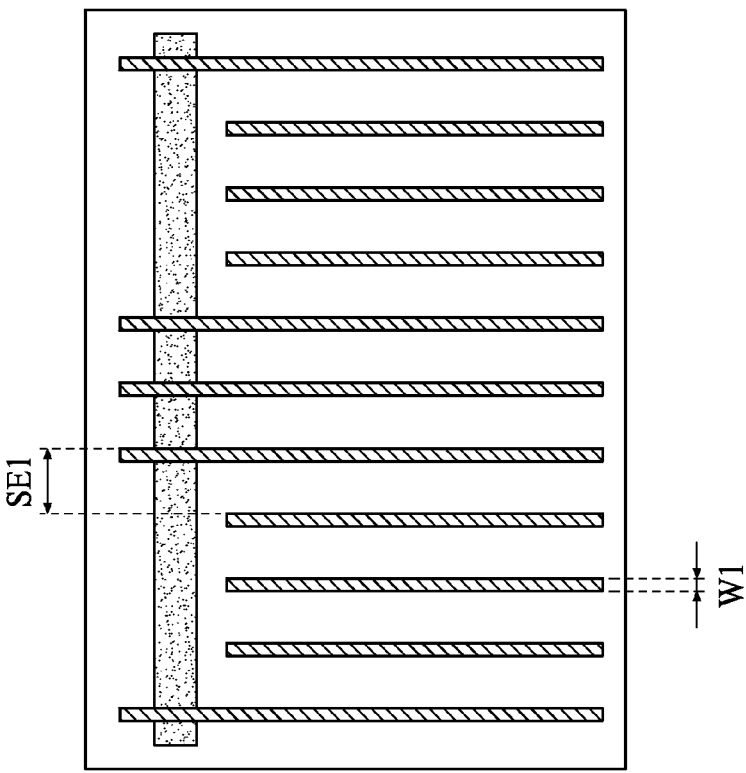
FIG. 2B is an exemplified second layout, according to various aspects of the present disclosure.

In some embodiments, an OPC rule for correcting the line spacing of masks used in a mid-end-of-line (MEOL) operation is disclosed. In this regard, FIG. 1 is a high-level flowchart 100 of an IC design method. In operations 101 and 102 of the illustrated flowchart 100, a communication module 607 in an IC design system 600 shown in FIG. 10 receives a first layout and a second layout. Referring to FIG. 2A, in some embodiments, the first layout 201 can possess a stripe pattern with each of the stripe thereon parallel arranged and having a width W1 (hereinafter a "first width") and a separation SE1 representing a pitch between two adjacent stripes (hereinafter a "first separation"). Referring to FIG. 2B, in some embodiments, the second layout 202 may also possesses a stripe pattern with each of the stripe thereon parallel arranged and having a width W2 (hereinafter a "second width") and a separation SE2 representing a pitch between two adjacent stripes (hereinafter a "second separation"). In some embodiments, the second width W2 of the stripe on the second layout 202 is narrower than the first separation SE1 on the first layout 201. In some embodiments, the first width W1 and the second width W2 can be in a range of from about 20 nm to about 25 nm. The first separation SE1 and the second separation SE2 can be in a range of from about 85 nm to about 95 nm.

Figure 3:
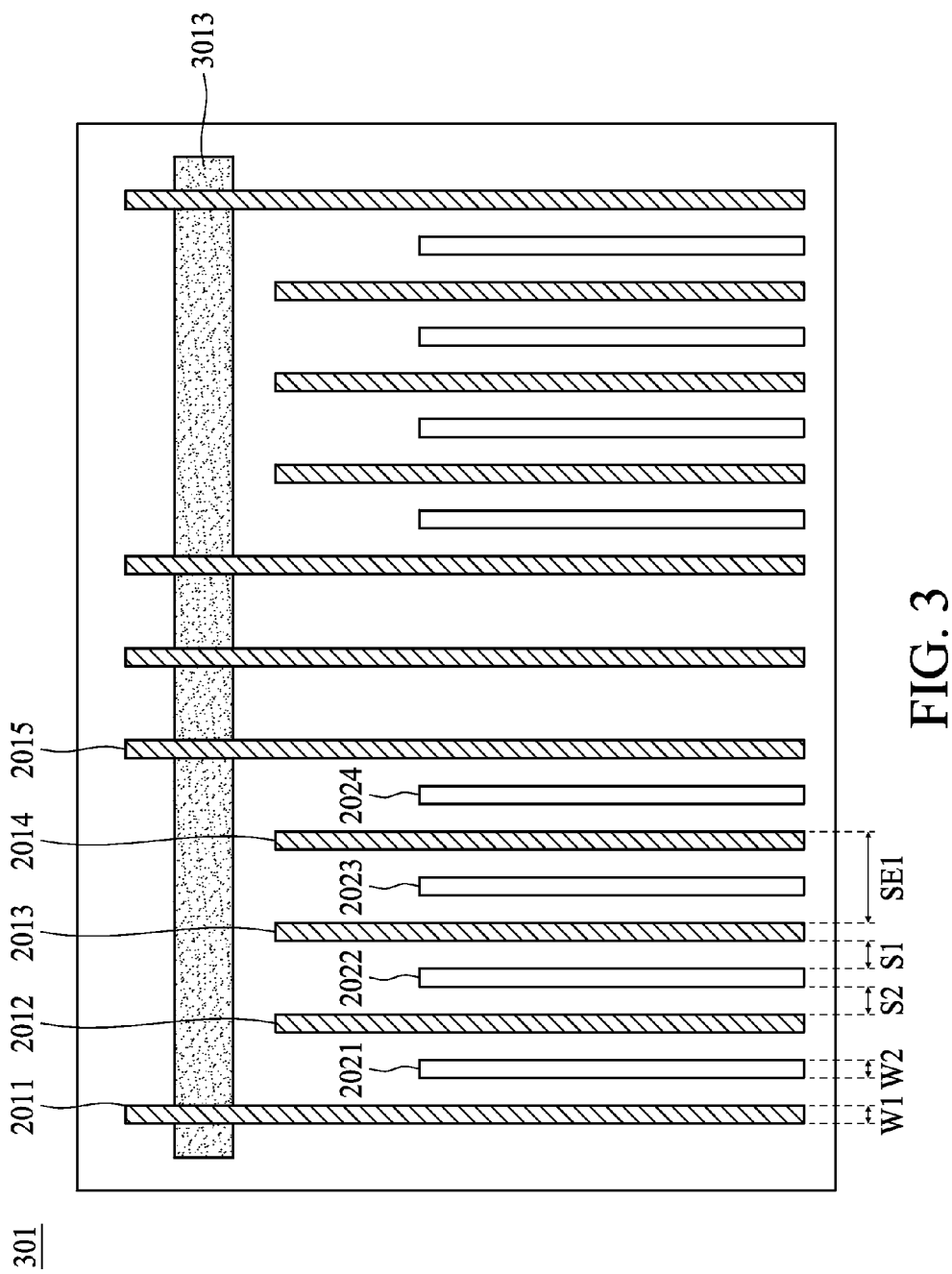
FIG. 3 is an exemplified stacked layout overlying the first layout and the second layout shown in FIG. 2A and FIG. 2B, according to various aspects of the present disclosure.

Referring to FIG. 3, FIG. 3 shows a stacked layout 301 overlying the first layout 201 and the second layout 202 shown in FIG. 2A and FIG. 2B, respectively. In some embodiments, a transverse stripe 3013 can be an isolation feature between an active region and a non-active region. An active region may include active components, such as metal-oxide-semiconductor field effect transistors (MOSFETs), complementary metal-oxide-semiconductor transistors (CMOSs), p-channel metal-oxide-semiconductor field effect transistors (PFETs), n-channel metal-oxide-semiconductor field effect transistor (NFETs), high voltage transistors, and/or high frequency transistors, and other suitable components. In FIG. 3, stripes 2021, 2022, 2023, 2024 of the second layout 202 are situated between two adjacent stripes of the first layout 201. For example, stripe 2022 is positioned between two adjacent stripes 2012 and 2013, that is, instead of partially overlapped with either of the two adjacent stripes 2012 and 2013, stripe 2022 is positioned, without overlapping, between the two adjacent stripes 2012 and 2013, and a measurable spacing S1 can be identified between a right side of the stripe 2022 and a left side of the stripe 2013. Similarly, a measurable spacing S2 can be identified between a left side of the stripe 2022 and a right side of the stripe 2012.

Although some embodiments of the present disclosure describe alternating line features on the IC design layout, the IC design layout encompassed by the scope of the present disclosure can includes various geometrical patterns representing features of an integrated circuit. For example, the IC design layout may includes main IC features such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The IC design layout may also include certain assist features, such as those features for imaging effect, processing enhancement, and/or mask identification information. People having ordinary skill in the art may understand that the communication module 607 of FIG. 10 can receive not only two layouts from a design house. Any suitable number of layouts can be received and given the instruction from a mass storage device 605 of FIG. 10, said number of layouts can be overlaid for further operations.

Figure 4:
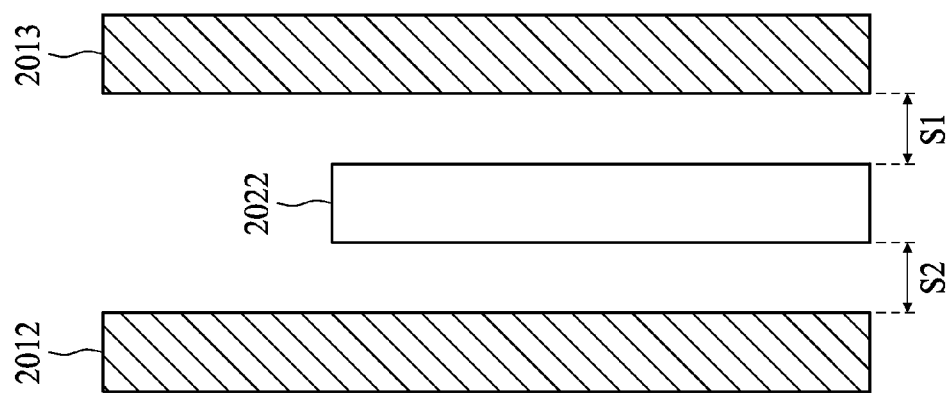
FIG. 4 is an enlarged view of one stripe on the second layout sandwiched by two stripes on the first layout, according to various aspects of the present disclosure.

Referring back to flowchart 100 of FIG. 1, operation 103 includes performing a separation check on the stacked layout 301. As can be seen in FIG. 4, an enlarged view of one stripe on the second layout sandwiched by two stripes on the first layout, and the spacing S1 and S2 thereof are shown. In performing the separation check, in some embodiments, spacing S1 is measured and the spacing S1 quantity stored in the system memory 603 of FIG. 10. The operation may proceed to operation 104 for performing a comparison of such spacing S1 and a predetermined value. However, in other embodiments, spacing S1 and spacing S2 are both measured and the spacing S1 and spacing S2 quantities stored in the system memory 603. The operation then proceeds to operation 104 for performing a comparison between a predetermined value and the spacing S1 and S2, respectively. In some embodiments, spacing S1 and spacing S2 are identical; in other embodiments spacing S1 and spacing S2 may be different.

Referring back to flowchart 100 of FIG. 1, operation 104 includes determining whether the spacing measured in previous operation 103 is greater than a predetermined value. In some embodiments, the determination is carried out by the processor 601 executing an instruction sent from the mass storage device 605 of the IC design system 600 in FIG. 10. The spacing S1 and/or S2 can be passed from the system memory 603 to the processor 601 and the predetermined value is set by the instructions from the mass storage device 605. When imposing the method 100 to different layout settings, different predetermined values can be set considering the desired spacing tolerance.

Referring back to flowchart 100 of FIG. 1, subsequent to the determining operation 104, when the determining result turns out to be "Yes", that is, the spacing measured is greater than the predetermined value, then the operation proceeds to operation 105; when the determining result turns out to be "No", that is, the spacing measured is not greater than the predetermined value, then the operation returns to operation 103, continuing the separation check operation 103 on the subsequent stripe. For example, as shown in FIG. 3 and FIG. 4, when the spacing S1 and/or S2 between stripe 2022 on the second layout 202 and the adjacent stripes 2012 and 2013 on the first layout 201 are determined to be not greater than the predetermined value, a subsequent separation check operation 103 is conducted on the stripe 2023 and the two adjacent stripes 2013 and 2014.

Figure 6:
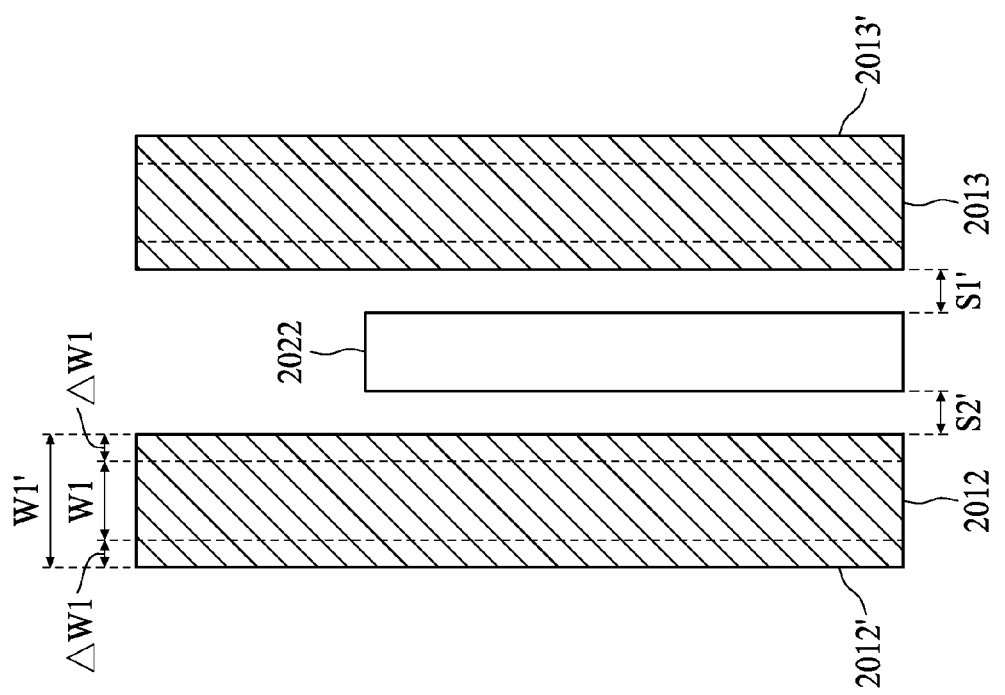
FIG. 6 is an enlarged view of one stripe on the second layout sandwiched by two stripes on the first layout during a spacing adjustment operation according to various aspects of the present disclosure.

Referring back to flowchart 100 of FIG. 1 and FIG. 4, when the determining operation 104 renders a "Yes" result, that is, either the spacing S1 or spacing S2 is greater than the predetermined value, then an operation 105 of adjusting the spacing between a right side of the stripe 2022 and a left side of the stripe 2013 is performed (when spacing S1 is greater than the predetermined value). On the other hand, the operation 105 can also adjust the spacing between a left side of the stripe 2022 and a right side of the stripe 2012 (when spacing S2 is greater than the predetermined value). For example, in some embodiments the predetermined value is about 30% of the first separation SE1. In some embodiments, as shown in FIG. 6, the first width W1 of the stripe 2012 and/or 2013 can be increased by a predetermined amount ΔW1 on each side to achieve an adjusted first width W1'. In some embodiments, the predetermined amount ΔW1 ranges between about 10% and about 20% of the first width W1. Consequently, spacing S2' and/or S1' between the stripe 2022 and (one of) the two adjacent stripe 2012' is decreased.

Figure 5:
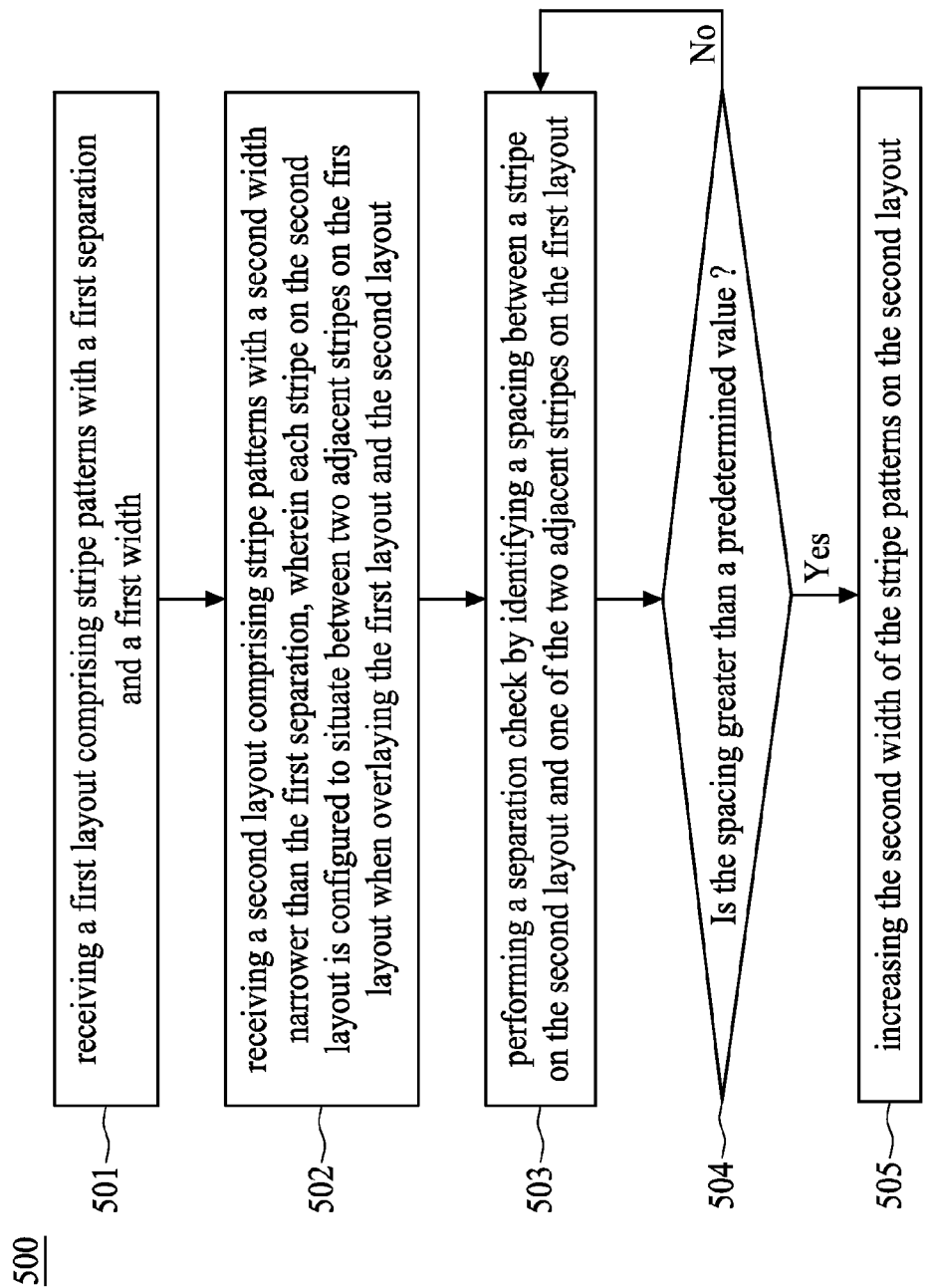
FIG. 5 is a high-level flowchart of an IC design method according to various aspects of the present disclosure.
Figure 7:
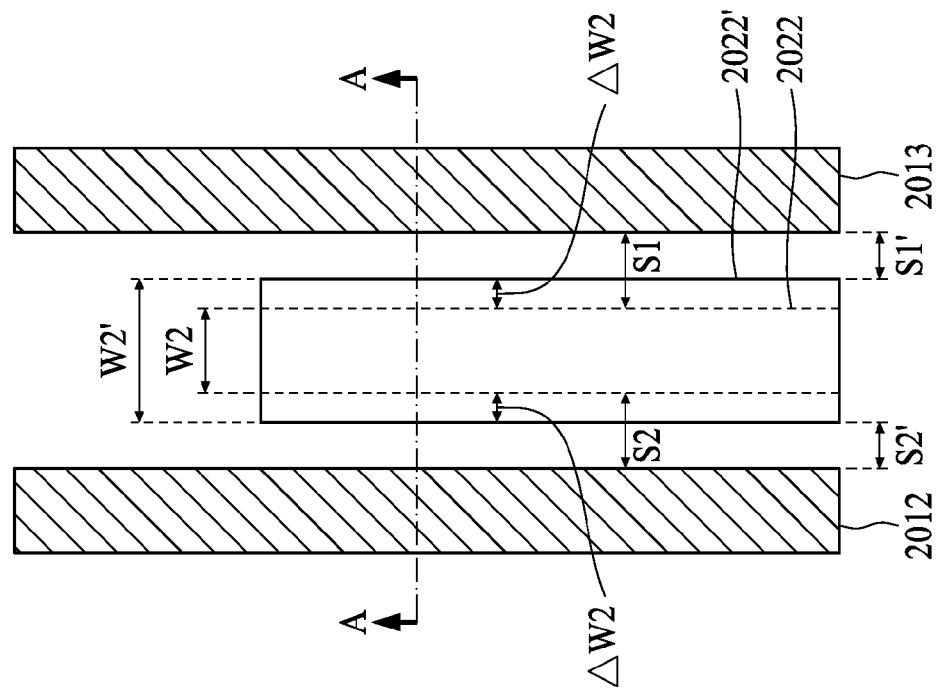
FIG. 7 is an enlarged view of one stripe on the second layout sandwiched by two stripes on the first layout in a spacing adjustment operation according to various aspects of the present disclosure.

Referring to FIG. 6 and FIG. 7, adjusting the spacing between the stripe 2022 and one of the two adjacent stripes 2012 and 2013 can be achieved either by increasing the first width W1 as shown in FIG. 6 or by increasing the second width W2 as shown in FIG. 7. In another high level process flow 500 shown in FIG. 5, operations 501, 502, 503, 504 are similar to those described previously in the process flow 100 of FIG. 1. However, operation 505 includes increasing the second width of the stripe on the second layout. Referring to FIG. 7, FIG. 7 is an enlarged view of one stripe 2022 on the second layout sandwiched by two adjacent stripes 2012 and 2013 on the first layout in the spacing adjustment operation 505. In some embodiments, as shown in FIG. 7, the second width W2 of the stripe 2022 can be increased by a predetermined amount ΔW2 on each side to achieve an adjusted second width W2'. In some embodiments, the predetermined amount ΔW2 ranges between about 10% and about 20% of the second width W2. Consequently, spacing S2' and/or S1' between the stripe 2022 and (one of) the two adjacent stripes 2012 (or 2013) is decreased.

Figure 8:
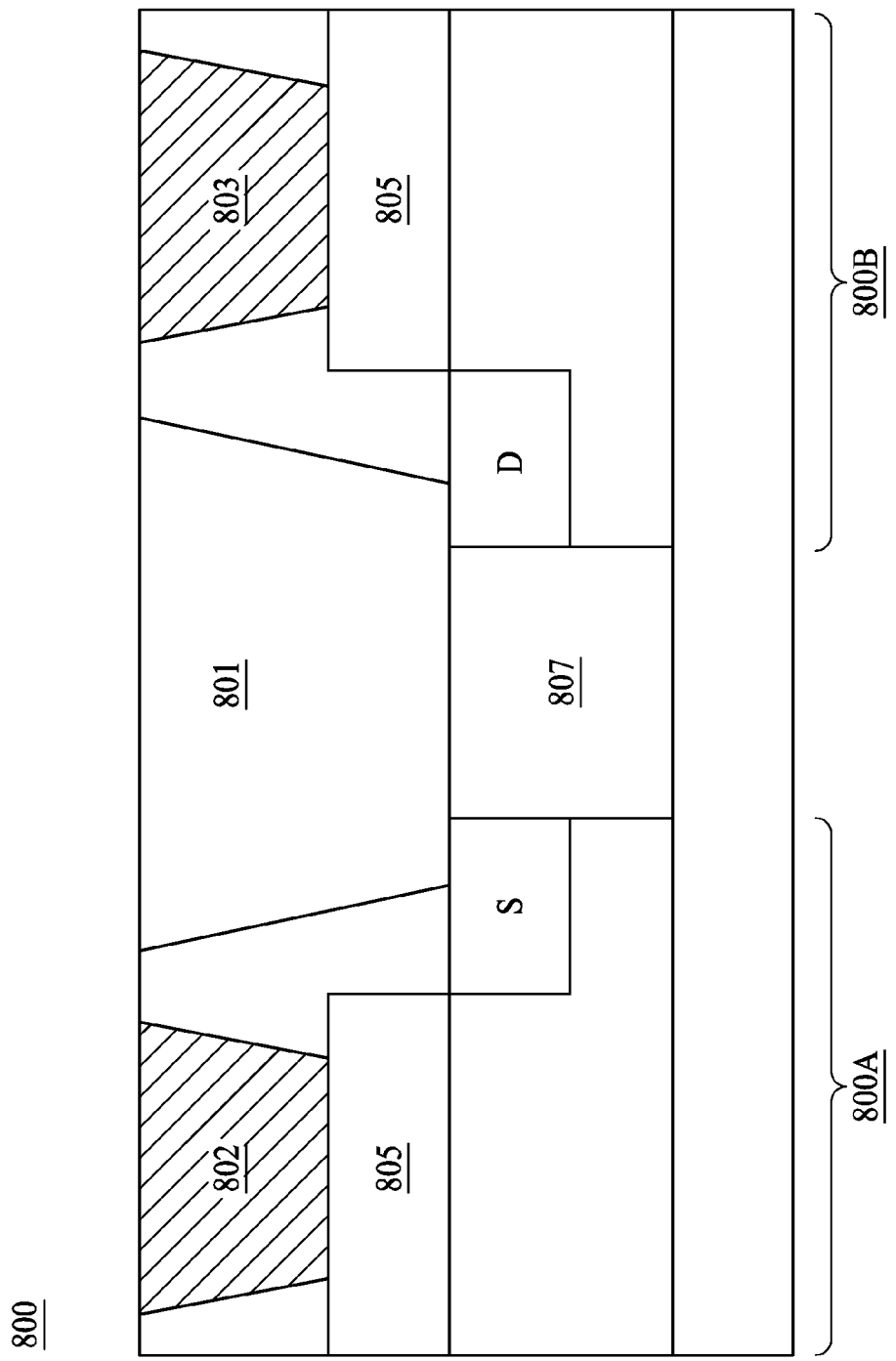
FIG. 8 is a cross sectional view of a portion of a semiconductor transistor structure manufactured using a proposed mask layout according to various aspects of the present disclosure.

FIG. 8 is a cross sectional view of a portion of a semiconductor transistor structure 800 manufactured using the proposed layout shown in FIG. 7. The layout shown in FIG. 7 is fabricated into masks that are subsequently used in the lithography operations of manufacturing the semiconductor transistor structure 800. FIG. 8 corresponds to a cross section dissecting from the semiconductor structures 800 placed underneath the layout (or mask) along line AA as shown in FIG. 7. Referring to FIG. 7 and FIG. 8, in some embodiments, the stripes 2012 and 2013 subsequently forms features on a first mask for patterning gate contacts 802 and 803 over gate 805 and gate 806, respectively, while stripes 2022 subsequently forms features on a second mask for patterning a source and/or a drain contacts 801. In some embodiments, the source and drain contact 801 is partially positioned on an isolation 807 electrically separating two transistor structures 800A and 800B, and partially connecting to the source S of the transistor structure 800A, as well as the drain of the transistor structure 800B. However, other semiconductor structures with alternating line features are also encompassed in the scope of the IC design methods 100 or 500.

Referring again to FIG. 7, in some embodiments, when the determining operation 504 renders a result that spacing S1 is greater than a predetermined value, but spacing S2 is not greater than the predetermined value, the second width W2 is increased by a predetermined amount ΔW2 on a left side of the stripe 2022. In other embodiments, when the determining operation 504 renders a result that both spacing S1 and spacing S2 are greater than a predetermined value, the second width W2 is increased by a predetermined amount ΔW2 on both sides of the stripe 2022. In still other embodiments, when the determining operation 104 renders a result that both spacing S1 and spacing S2 are not greater than a predetermined value, then the IC design system 600 in FIG. 10 start processing a subsequent stripe and reiterating the separation check operation 503. In some embodiments, the predetermined value to be compared with the spacing S1 or spacing S2 is set to be about 30 nm. In some embodiments, the predetermined amount ΔW1, ΔW2 for increasing the first width W1 or a second width W2 are set to be around 2 nm.

Figure 9:
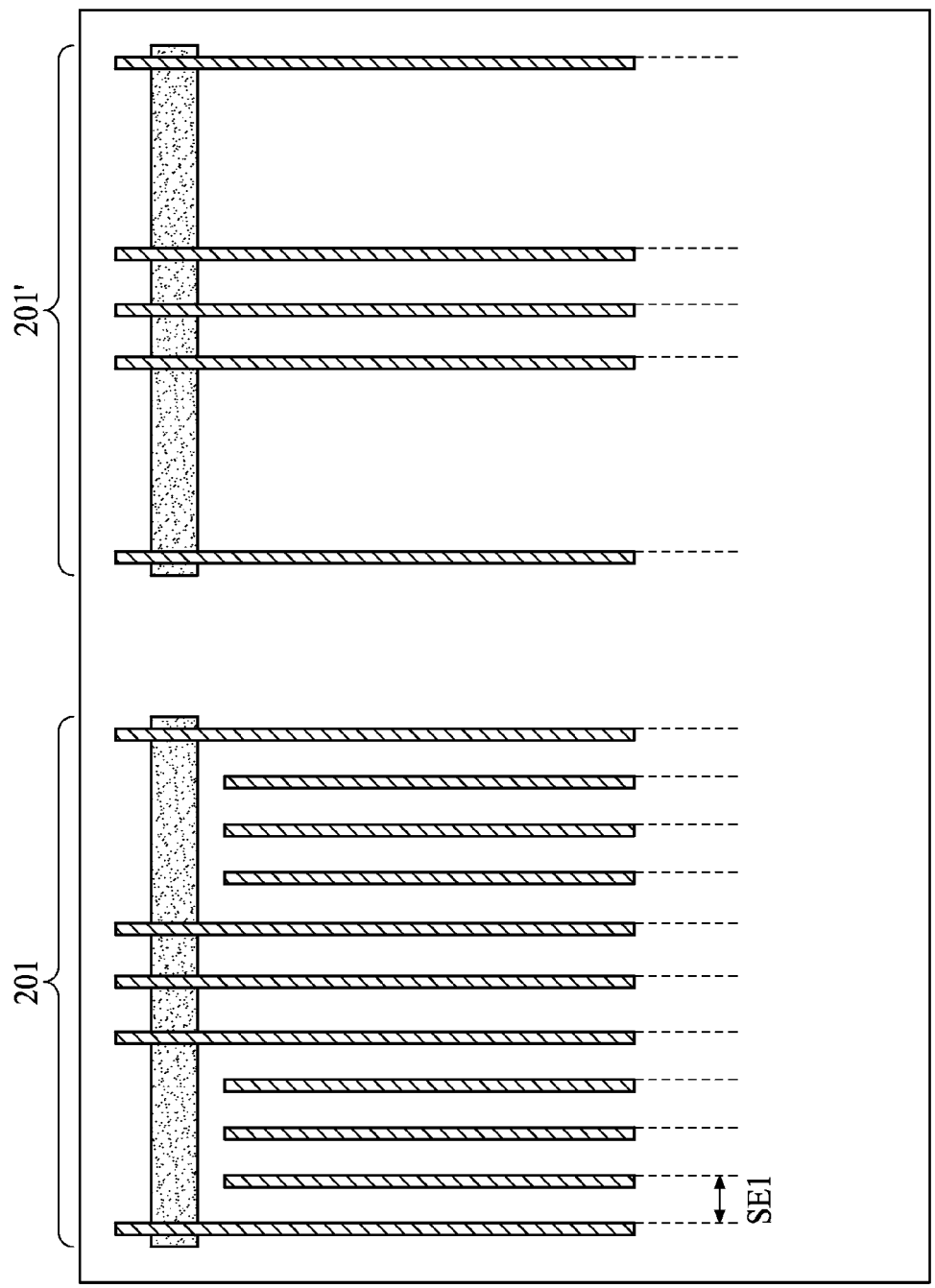
FIG. 9 is a top view of a first layout with a dense region and an isolated region according to various aspects of the present disclosure.

Referring to FIG. 9, the area of a first layout may be separated into at least a portion of isolated region 201', and another portion of dense region 201. For example, in a system on a chip ("SOC") process of manufacturing a logic circuit and a memory cell, such as a read only memory, a static random access memory, a flash memory or a dynamic random access memory on the same chip, the logic circuit relates to an isolated region 201' and the memory cell relates to a dense region 201 in general. In some embodiments, an IC design method further includes an operation distinguishing a dense stripe pattern region from an isolated stripe pattern region prior to the separation check operation. For example, if a layout region is identified as an isolated region 201', the subsequent separation check operation 103, the determining operation 104, and the spacing adjusting operation 105 will not be carried out. However, if a layout region is identified as a dense region 201, the aforementioned operations 103, 104, and 105 are carried out as described in the present disclosure. Similarly the operation distinguishing the dense region from the isolated region can be implemented into the flowchart 500.

The IC design methods described herein provide a rule to correct a critical dimension of line features under appropriate conditions. For example, the separation check operation provides a measure to identify spacing between two features eventually, through lithography operation, to be fabricated on a semiconductor structure. If the separation is greater than a predetermined value, the critical dimension can be expanded to provide a broader process window for subsequent manufacturing operations. On the other hand, if the separation is not greater than the predetermined value, the critical dimension is retained as those on layouts originally received from a design house. This is to prevent the deterioration of device performance (e.g. decrease of the breakdown voltage) occurring when the spacing between line features is too small. Based on different semiconductor line features to be fabricated, the predetermined value can be set accordingly in a non-transitory, computer readable storage device.

Figure 10:
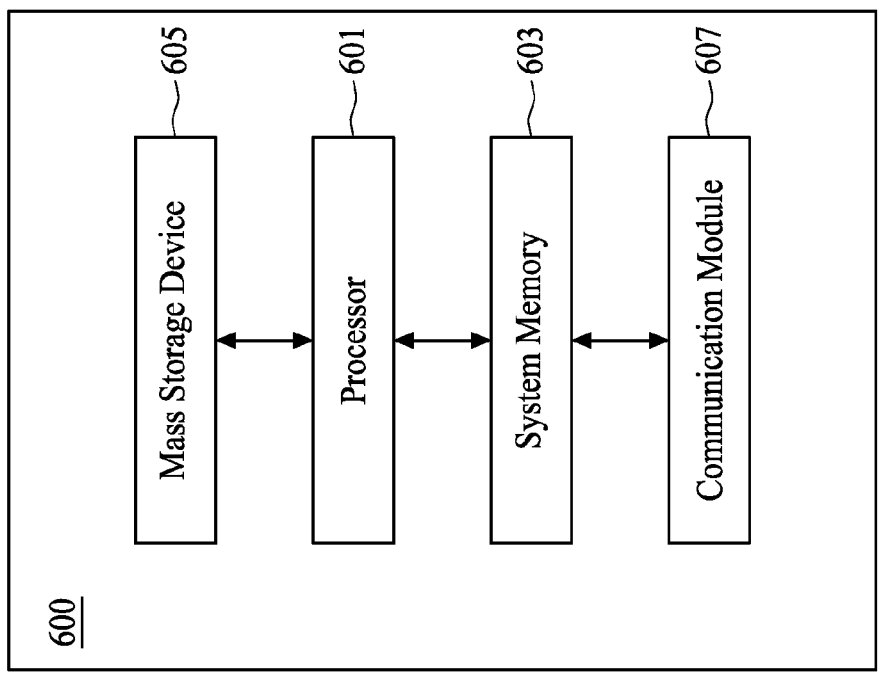
FIG. 10 is a simplified block diagram of an IC design system according to various aspects of the present disclosure.

In FIG. 10, an IC design system 600 is illustrated in a block diagram. The IC design system 600 includes an information handling system such as a computer, server, workstation, or other suitable device. The system 600 includes a processor 601 that is communicatively coupled to a system memory 603, a mass storage device 605, and a communication module 607. The system memory 603 provides the processor 601 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 605. Examples of mass storage devices 605 may include hard discs, optical disks, magneto-optical discs, solid-state storage devices, and/or a variety other mass storage devices known in the art. The communication module 607 is operable to communicate information such as IC design layout with the other components in an IC design system, such as a design house. Examples of communication modules may include Ethernet cards, 802.11 WiFi devices, cellular data radios, and/or other suitable devices known in the art.

Referring to FIG. 10, in some embodiments, the communication module 607 is configured to communicatively couple with the processor 601 and to receive IC design layout from an IC design house (not shown in FIG. 10). In some embodiments, the IC design layout includes a first layout having stripe patterns with a first separation and a first width, and a second layout having stripe patterns with a second width. The terms used in the present description that is identical to other terms previously discussed in the present disclosure direct to substantially identical items or the equivalents thereof. In some embodiments, the mass storage device 605 is a hard disk or the like that includes computer-readable instruction executable by the processor 601. For example, the instruction includes, but not limited to, (1) instruction to overlay the first layout and the second layout; (2) instruction to perform a separation check by identifying a spacing between a stripe on the second layout and one of two adjacent stripes on the first layout, wherein each stripe on the second layout is configured to situate between the two adjacent stripes on the first layout when overlaying the first layout and the second layout; and (3) instruction to increase the second width of the stripe on the second layout when the separation check determining the spacing is greater than a predetermined value.

As previously discussed, the separation check instruction further includes instructions to identify the spacing between the stripe on the second layout and each of the two adjacent stripes on the first layout as described in FIGS. 4, 6, and 7. The increase the second width instruction further includes instruction to increase the second width by about 10% to about 20% of the second width as described as ΔW1 and ΔW2 in FIGS. 6 and 7. The increase the second width instruction further includes instruction to set the predetermined value to be about 30% of the first separation. The instruction stored in the mass storage device 600 may further include instruction to distinguish a dense stripe pattern region from an isolated stripe pattern region on the first layout, and performing the subsequent instructions (i.e. separation check and increase the second width by a predetermined amount) over the dense stripe pattern region.

Some embodiments of the present disclosure provide an integrated circuit (IC) design method. The method includes (1) receiving a first layout comprising stripe patterns with a first separation and a first width; (2) receiving a second layout comprising stripe patterns with a second width narrower than the first separation, each stripe on the second layout is configured to situate between two adjacent stripes on the first layout when overlaying the first layout and the second layout; (3) performing a separation check by identifying a spacing between a stripe on the second layout and one of the two adjacent stripes on the first layout; and (4) adjusting the spacing between the stripe on the second layout and one of the two adjacent stripes on the first layout when the separation check determining the spacing is greater than a predetermined value.

In some embodiments of the present disclosure, the performing a separation check further includes identifying the spacing between the stripe on the second layout and each of the two adjacent stripes on the first layout.

In some embodiments of the present disclosure, the adjusting the spacing between the stripe on the second layout and one of the two adjacent stripes on the first layout includes increasing the second width of the stripe on the second layout.

In some embodiments of the present disclosure, the increasing the second width of the stripe on the second layout includes increasing from about 10% to about 20% of the second width.

In some embodiments of the present disclosure, the adjusting the separation between the stripe on the second layout and one of the two adjacent stripes on the first layout includes increasing the first width of the stripe on the first layout.

In some embodiments of the present disclosure, the increasing the first width of the stripe on the first layout includes increasing the first width by about 10% to about 20% of the first width.

In some embodiments of the present disclosure, the adjusting the spacing between the stripe on the second layout and one of the two adjacent stripes on the first layout when the separation check determining the spacing is larger than a predetermined value includes the predetermined value to be 30% of the first separation.

In some embodiments of the present disclosure, the IC design method further includes distinguishing a dense stripe pattern region from an isolated stripe pattern region on the first layout, wherein the performing the separation check and the adjusting the spacing are processed over the dense stripe pattern region.

Some embodiments of the present disclosure provide an IC design method. The method includes (1) receiving a first layout comprising stripe patterns with a first separation and a first width; (2) receiving a second layout comprising stripe patterns with a second width narrower than the first separation, wherein each stripe of the stripe patterns on the second layout is configured to situate between two adjacent stripes on the first layout when overlaying the first layout and the second layout; (3) performing a separation check by identifying a spacing between a stripe on the second layout and one of the two adjacent stripes on the first layout; and (4) increasing the second width of the stripe on the second layout when the separation check determining the spacing is greater than a predetermined value.

In some embodiments of the present disclosure, the first layout includes stripe patterns configured to form contacts over gate regions.

In some embodiments of the present disclosure, the second layout comprises stripe patterns configured to form contacts adjacent to gate regions.

In some embodiments of the present disclosure, the performing a separation check further includes identifying the spacing between the stripe on the second layout and each of the two adjacent stripes on the first layout.

In some embodiments of the present disclosure, the increasing the second width of the stripe on the second layout includes increasing the second width by 2 nm on each side of a major dimension.

In some embodiments of the present disclosure, the increasing the second width of the stripe on the second layout when the separation check determining the spacing is greater than a predetermined value includes the predetermined value of 30 nm.

In some embodiments of the present disclosure, the IC design method further includes distinguishing a dense stripe pattern region from an isolated stripe pattern region on the first layout. The performing the separation check and the increasing the second width are processed over the dense stripe pattern region.

Some embodiments of the present disclosure provide an IC design system. The system includes a processor; a communication module communicatively coupled to the processor and configured to receive a first layout comprising stripe patterns with a first separation and a first width and a second layout comprising stripe patterns with a second width narrower than the first separation; and a non-transitory, computer-readable storage communicatively coupled to the processor and including instructions executable by the processor. The instructions includes (1) instruction to overlay the first layout and the second layout; (2) instruction to perform a separation check by identifying a spacing between a stripe on the second layout and one of two adjacent stripes on the first layout, wherein each stripe on the second layout is configured to situate between the two adjacent stripes on the first layout when overlaying the first layout and the second layout; and (3) instruction to increase the second width of the stripe on the second layout when the separation check determining the spacing is greater than a predetermined value.

In some embodiments of the present disclosure, the instruction to perform the separation check further includes identifying the spacing between the stripe on the second layout and each of the two adjacent stripes on the first layout.

In some embodiments of the present disclosure, the instruction to increase the second width on the second layout when the separation check determining the spacing is greater than a predetermined value further includes increasing the second width by about 10% to about 20% of the second width.

In some embodiments of the present disclosure, the instruction to increase the second width on the second layout when the separation check determining the spacing is greater than a predetermined value includes the predetermined value to be 30% of the first separation.

In some embodiments of the present disclosure, the instructions of the IC design system further includes an instruction to distinguish a dense stripe pattern region from an isolated stripe pattern region on the first layout. The instruction to perform the separation check and the instruction to increase the second width are processed over the dense stripe pattern region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) design method, comprising:
receiving a first layout comprising stripe patterns with a first separation and a first width;
receiving a second layout comprising stripe patterns with a second width narrower than the first separation, wherein each stripe of the stripe patterns on the second layout is configured to situate between two adjacent stripes of the stripe patterns on the first layout when overlaying the first layout and the second layout;
performing a separation check by identifying a spacing between a stripe on the second layout and one of the two adjacent stripes on the first layout; and
adjusting the spacing between the stripe on the second layout and one of the two adjacent stripes on the first layout when the separation check determining the spacing is greater than a predetermined value.

2. The IC design method as in claim 1, wherein the performing a separation check further comprises identifying the spacing between the stripe on the second layout and each of the two adjacent stripes on the first layout.

3. The IC design method as in claim 1, wherein the adjusting the spacing between the stripe on the second layout and one of the two adjacent stripes on the first layout comprises increasing the second width of the stripe on the second layout.

4. The IC design method as in claim 3, wherein the increasing the second width of the stripe on the second layout comprises increasing from about 10% to about 20% of the second width.

5. The IC design method as in claim 1, wherein the adjusting the separation between the stripe on the second layout and one of the two adjacent stripes on the first layout comprises increasing the first width of the stripe on the first layout.

6. The IC design method as in claim 5, wherein the increasing the first width of the stripe on the first layout comprises increasing the first width by about 10% to about 20% of the first width.

7. The IC design method as in claim 1, wherein the adjusting the spacing between the stripe on the second layout and one of the two adjacent stripes on the first layout when the separation check determining the spacing is larger than a predetermined value comprises the predetermined value to be 30% of the first separation.

8. The IC design method as in claim 1, further comprising distinguishing a dense stripe pattern region from an isolated stripe pattern region on the first layout, wherein the performing the separation check and the adjusting the spacing are processed over the dense stripe pattern region.

9. An integrated circuit (IC) design method, comprising:
receiving a first layout comprising stripe patterns with a first separation and a first width;

receiving a second layout comprising stripe patterns with a second width narrower than the first separation, wherein each stripe of the stripe patterns on the second layout is configured to situate between two adjacent stripes of the stripe patterns on the first layout when overlaying the first layout and the second layout;

performing a separation check by identifying a spacing between a stripe on the second layout and one of the two adjacent stripes on the first layout; and increasing the second width of the stripe on the second layout when the separation check determining the spacing is greater than a predetermined value.

10. The IC design method as in claim 9, wherein the first layout comprises stripe patterns configured to form contacts over gate regions.

11. The IC design method as in claim 9, wherein the second layout comprises stripe patterns configured to form contacts adjacent to gate regions.

12. The IC design method as in claim 9, wherein the performing a separation check further comprises identifying the spacing between the stripe on the second layout and each of the two adjacent stripes on the first layout.

13. The IC design method as in claim 9, wherein the increasing the second width of the stripe on the second layout comprises increasing the second width by 2 nm on each side of a major dimension.

14. The IC design method as in claim 9, wherein the increasing the second width of the stripe on the second layout when the separation check determining the spacing is greater than a predetermined value comprises the predetermined value of 30 nm.

15. The IC design method as in claim 9, further comprising distinguishing a dense stripe pattern region from an isolated stripe pattern region on the first layout, wherein the performing the separation check and the increasing the second width are processed over the dense stripe pattern region.

16. An integrated circuit (IC) design system, comprising:
a processor;
a communication module communicatively coupled to the processor and configured to receive a first layout comprising stripe patterns with a first separation and a first width and a second layout comprising stripe patterns with a second width narrower than the first separation; and
a non-transitory, computer-readable storage communicatively coupled to the processor and including instructions executable by the processor, the instructions including:
instruction to overlay the first layout and the second layout;
instruction to perform a separation check by identifying a spacing between a stripe of the stripe patterns on the second layout and one of two adjacent stripes of the stripe patterns on the first layout, wherein each stripe on the second layout is configured to situate between the two adjacent stripes on the first layout when overlaying the first layout and the second layout; and
instruction to increase the second width of the stripe on the second layout when the separation check determining the spacing is greater than a predetermined value.

17. The IC design system of claim 16, wherein the instruction to perform the separation check further comprises identifying the spacing between the stripe on the second layout and each of the two adjacent stripes on the first layout.

18. The IC design system of claim 16, wherein the instruction to increase the second width on the second layout when the separation check determining the spacing is greater than a predetermined value further comprises increasing the second width by about 10% to about 20% of the second width.

19. The IC design system of claim 16, wherein the instruction to increase the second width on the second layout when the separation check determining the spacing is greater than a predetermined value comprises the predetermined value to be 30% of the first separation.

20. The IC design system of claim 16, further comprising an instruction to distinguish a dense stripe pattern region from an isolated stripe pattern region on the first layout, wherein the instruction to perform the separation check and the instruction to increase the second width are processed over the dense stripe pattern region.

* * * * *